United States Patent
Bhattacharyya (10) Patent No.: US 7,456,054 B2
(45) Date of Patent: Nov. 25, 2008

(54) GATED LATERAL THYRISTOR-BASED RANDOM ACCESS MEMORY CELL (GLTRAM)

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 498 days.

(21) Appl. No.: 11/209,228

(22) Filed: Aug. 23, 2005

(65) Prior Publication Data

US 2005/0280023 A1 Dec. 22, 2005

Related U.S. Application Data

(62) Division of application No. 10/232,855, filed on Aug. 30, 2002, now Pat. No. 7,042,027.

(51) Int. Cl.
*H01L 21/332* (2006.01)
(52) U.S. Cl. ................ 438/135; 438/300; 257/E21.389
(58) Field of Classification Search ................. 438/135, 438/300; 257/E21.388, E21.389
See application file for complete search history.

(56) References Cited

U.S. PATENT DOCUMENTS

| | | | |
|---|---|---|---|
| 2,794,917 A | 6/1957 | Shockley | |
| 2,899,646 A | 8/1959 | Read | |
| 3,918,033 A | 11/1975 | Case et al. | |
| 3,978,577 A | 9/1976 | Bhattacharyya et al. | |
| 4,488,262 A | 12/1984 | Basire et al. | |
| 4,692,785 A | 9/1987 | Wada | |
| 4,791,604 A | 12/1988 | Lienau et al. | |
| 4,870,470 A | 9/1989 | Bass, Jr. et al. | |
| 5,396,454 A | 3/1995 | Nowak | |
| 5,488,243 A | 1/1996 | Tsuruta et al. | |
| 5,557,569 A | 9/1996 | Smayling et al. | |
| 5,627,779 A | 5/1997 | Odake et al. | |
| 5,686,739 A | 11/1997 | Baba | |
| 5,814,853 A | 9/1998 | Chen | |
| 6,049,109 A | 4/2000 | Omura et al. | |
| 6,104,045 A | 8/2000 | Forbes et al. | |

(Continued)

OTHER PUBLICATIONS

Lee, "Low Temperature Poly-Si Thin-Film Transistor Fabrication by Metal-Induced Lateral Crystallization", Apr. 1996, IEEE Electron Device Letters, pp. 160-162.*

(Continued)

*Primary Examiner*—Chandra Chaudhari
(74) *Attorney, Agent, or Firm*—Schwegman, Lundberg & Woessner, P.A.

(57) ABSTRACT

One aspect of the present subject matter relates to a memory cell, or more specifically, to a scalable GLTRAM cell that provides DRAM-like density and SRAM-like performance. According to various embodiments, the memory cell includes an access transistor and a gated, lateral thyristor integrally formed above the access transistor. The access transistor has a drain region, a raised source region, and a gate. The thyristor has a first end that is formed with the raised source region of the access transistor. In various embodiments, the lateral thyristor is fabricated using a metal-induced lateral crystallization technique (MILC) adopted for thin-film-transistor (TFT) technology. In various embodiments, the stacked lateral thyristor is integrated by raising the source region of the access transistor using a selective epitaxy process for raised source-drain technology. Other aspects are provided herein.

23 Claims, 5 Drawing Sheets

U.S. PATENT DOCUMENTS

| | | |
|---|---|---|
| 6,229,161 B1 | 5/2001 | Nemati et al. |
| 6,243,296 B1 | 6/2001 | Sansbury |
| 6,248,626 B1 | 6/2001 | Kumar et al. |
| 6,294,427 B1 | 9/2001 | Furuhata et al. |
| 6,462,359 B1 | 10/2002 | Nemati et al. |
| 6,545,297 B1 | 4/2003 | Noble et al. |
| 6,574,143 B2 | 6/2003 | Nakazato |
| 6,600,188 B1 | 7/2003 | Jiang et al. |
| 6,611,452 B1 | 8/2003 | Han |
| 6,617,651 B2 | 9/2003 | Ohsawa |
| 6,638,627 B2 | 10/2003 | Potter |
| 6,653,174 B1 | 11/2003 | Cho et al. |
| 6,653,175 B1 | 11/2003 | Nemati et al. |
| 6,653,665 B2 | 11/2003 | Kajiyama |
| 6,660,616 B2 | 12/2003 | Babcock et al. |
| 6,661,042 B2 | 12/2003 | Hsu |
| 6,812,504 B2 | 11/2004 | Bhattacharyya |
| 6,845,034 B2 | 1/2005 | Bhattacharyya |
| 6,881,994 B2 | 4/2005 | Lee et al. |
| 6,888,200 B2 | 5/2005 | Bhattacharyya |
| 6,903,969 B2 | 6/2005 | Bhattacharyya |
| 6,917,078 B2 | 7/2005 | Bhattacharyya |
| 6,965,129 B1 | 11/2005 | Horch et al. |
| 7,042,027 B2 | 5/2006 | Bhattacharyya |
| 7,145,186 B2 | 12/2006 | Bhattacharyya |
| 7,184,312 B2 | 2/2007 | Bhattacharyya |
| 7,245,535 B2 | 7/2007 | McCollum et al. |
| 7,291,519 B2 | 11/2007 | Bhattacharyya |
| 7,339,830 B2 | 3/2008 | Bhattacharyya |
| 2002/0048190 A1 | 4/2002 | King |
| 2002/0105023 A1 | 8/2002 | Kuo et al. |
| 2003/0042534 A1 | 3/2003 | Bhattacharyya et al. |
| 2003/0072126 A1 | 4/2003 | Bhattacharyya |
| 2003/0089942 A1 | 5/2003 | Bhattacharyya |
| 2003/0151948 A1 | 8/2003 | Bhattacharyya et al. |
| 2003/0160277 A1 | 8/2003 | Bhattacharyya et al. |
| 2004/0007734 A1 | 1/2004 | Kato et al. |
| 2004/0014304 A1 | 1/2004 | Bhattacharyya |
| 2004/0041206 A1 | 3/2004 | Bhattacharyya |
| 2004/0246764 A1 | 12/2004 | King |
| 2005/0012119 A1 | 1/2005 | Herner et al. |
| 2005/0047251 A1 | 3/2005 | Bhattacharya |
| 2005/0099839 A1 | 5/2005 | Bhattacharyya |
| 2005/0247962 A1 | 11/2005 | Bhattacharyya |
| 2005/0250261 A1 | 11/2005 | Bhattacharyya |
| 2005/0263763 A1 | 12/2005 | Bhattacharyya |
| 2005/0269628 A1 | 12/2005 | King |
| 2006/0043411 A1 | 3/2006 | Bhattacharayya |
| 2006/0227601 A1 | 10/2006 | Bhattacharyya |
| 2006/0244007 A1 | 11/2006 | Bhattacharyya |
| 2006/0245244 A1 | 11/2006 | Bhattacharyya |
| 2006/0246653 A1 | 11/2006 | Bhattacharyya |
| 2007/0138555 A1 | 6/2007 | Bhattacharyya |

OTHER PUBLICATIONS

Bauer, F, et al., "Design aspects of MOS controlled thyristor elements", *International Electron Devices Meeting 1989. Technical Digest*, (1989), 297-300.

Bhattacharyya, A., "Physical & Electrical Characteristics of LPCVD Silicon Rich Nitride", *ECS Technical Digest, J. Electrochem. Soc.*, 131(11), 691 RDP, New Orleans, (1984), 469C.

Chang, H R., et al., "MOS trench gate field-controlled thyristor", *Technical Digest—International Electron Devices Meeting*, (1989), 293-296.

Fazan, P, et al., "Capacitor-Less 1-Transistor DRAM", *IEEE International SOI Conference*, (2002), 10-13.

Frohman-Bentchkowsky, D, "An integrated metal-nitride-oxide-silicon (MNOS) memory", *Proceedings of the IEEE*, 57(6), (Jun. 1969), 1190-1192.

Jagar, S, "Single grain thin-film-transistor (TFT) with SOI CMOS performance formed by metal-induced-lateral-crystallization", *International Electron Devices Meeting 1999. Technical Digest*, (1999), 293-6.

Nemati, F, et al., "A novel high density, low voltage SRAM cell with a vertical NDR device", *1998 Symposium on VLSI Technology Digest of Technical Papers*, (1998), 66-7.

Nemati, F, et al., "A novel thyristor-based SRAM cell (T-RAM) for high-speed, low-voltage, giga-scale memories", *International Electron Devices Meeting 1999. Technical Digest*, (1999), 283-6.

Ohsawa, T, et al., "Memory design using one-transistor gain cell on SOI", *IEEE International Solid-State Circuits Conference. Digest of Technical Papers*, vol. 1, (2002), 452-455.

Okhonin, S, "A SOI capacitor-less 1T-DRAM concept", *2001 IEEE International SOI Conference. Proceedings, IEEE. 2001*, (2000), 153-4.

Shinohe, T, et al., "Ultra-high di/dt 2500 V MOS assisted gate-triggered thyristors (MAGTs) for high repetition excimer laser system", *International Electron Devices Meeting 1989. Technical Digest*, (1989), 301-4.

Van Meer, H, "Ultra-thin film fully-depleted SOI CMOS with raised G/S/D device architecture for sub-100 nm applications", *2001 IEEE International SOI Conference*, (2001), 45-6.

\* cited by examiner

GATED LATERAL THYRISTOR-BASED RANDOM ACCESS MEMORY CELL (GLTRAM)

CROSS REFERENCE TO RELATED APPLICATIONS

The present application is a divisional of U.S. application Ser. No. 10/232,855, filed Aug. 30, 2002 now U.S. Pat. No. 7,042,027. This application is related to the following commonly assigned U.S. patent application: "One Transistor SOI Non-Volatile Random Access Memory Cell" U.S. application Ser. No. 10/232,846, filed Aug. 30, 2002, now issued as U.S. Pat. No. 6,917,078. These applications are herein incorporated by reference in their entirety

TECHNICAL FIELD

This disclosure relates generally to integrated circuits, and more particularly, to gated lateral thyristor-based random access memory (GLTRAM) cells.

BACKGROUND

Integrated circuit memory includes dynamic random access memory (DRAM) and static random access memory (SRAM). DRAM cells provide good memory density, but are relatively slow. SRAM cells are faster than DRAM cells, but the required area for SRAM cells is large. The large area associated with six-transistor and four-transistor memory cells has limited the design of high density static random access memory (SRAM) devices.

Negative Differential Resistance (NDR) devices have been used to reduce the number of elements per memory cell. However, NDR devices tend to suffer from problems such as high standby power consumption, high operating voltages, low speeds and complicated fabrication processes.

F. Nemati and J. D. Plummer have disclosed a two-device thyristor-based SRAM cell (TRAM) that includes an access transistor and a gate-assisted, vertical thyristor. The disclosed vertical p+/n/p/n+ thyristor is operated in a gate-enhanced switching mode to provide the memory cell with SRAM-like performance and DRAM-like density. The performance of the TRAM cell depends on the turn-off characteristics of the vertical thyristor, and the turn-off characteristics depend on the stored charge and carrier transit time in the p-region of the p+/n/p/n+ thyristor. The turn-off characteristics for the vertical thyristor is improved from milliseconds to five nanoseconds by reverse biasing the thyristor for a write-zero operation and by using a gate to assist with turn-off switching of the thyristor by discharging the stored charge. Even so, the geometry and vertical height of the vertical thyristor's p-region limits the turn-off characteristics and the associated cell performance of the gate-assisted, vertical thyristor disclosed by Nemati and Plummer. The scalability of the TRAM cell and the ability to control the performance of the TRAM cell are also limited.

There is a need in the art to provide improved memory cells that provide DRAM-like density, faster SRAM-like performance, and scalability.

SUMMARY

The above mentioned problems are addressed by the present subject matter and will be understood by reading and studying the following specification. The present subject matter relates to a one-device equivalent, gated lateral thyristor-based random access memory (GLTRAM) cell. The GLTRAM cell includes an access transistor and an integrated, gate-assisted lateral thyristor. The lateral gate-assisted thyristor is integrated with and stacked on top of the access transistor to enhance the density of the cell. The geometry of the lateral thyristor (including, for example, the p-region in a p+/n/p/n+ thyristor) is accurately controlled to provide a lower stored charge volume and is capable of being tailored to reduce carrier transit time which provides faster performance and improves the gate-assisted turn-off characteristics of the thyristor.

In various embodiments, the lateral thyristor is fabricated using a metal-induced lateral crystallization technique (MILC) adopted for thin-film-transistor (TFT) technology. Thus, the GLTRAM cell is readily scalable with lithography so as to provide direct scalability with technology generations. In various embodiments, the stacked lateral thyristor is integrated by raising the source region of the access transistor using a selective epitaxy process for raised source-drain technology. The stacked configuration of the GLTRAM cell has a footprint less than 8 $F^2$, and thus has a higher density than the TRAM cell. Additionally, the GLTRAM cell has low standby power consumption during cell operation.

One aspect of the present subject matter relates to a memory cell, or more specifically, to a GLTRAM cell. According to various embodiments, the memory cell includes an access transistor and a gated, lateral thyristor integrally formed above the access transistor. The access transistor has a drain region, a raised source region, and a gate. The gated, lateral thyristor has a first end that is formed with the raised source region of the access transistor. According to various embodiments, the thyristor is formed by depositing a thin layer of amorphous silicon and re-crystallizing the silicon using a metal-induced lateral crystallization technique (MILC). In various embodiments, the raised source region is fabricated using a selective epitaxy process.

One aspect of the present subject matter relates to a method for forming a memory cell. In various embodiments, an access transistor and a lateral thyristor are formed. The access transistor is formed with a drain region to connect to a bit line, a raised source region, and a transistor gate to connect to a first word line. A first end of the thyristor is formed with the raised source region of the access transistor. The lateral thyristor is formed with a second end to connect to a reference voltage. The thyristor is formed with a thyristor gate to connect to a second word line. In various embodiments, the lateral thyristor is formed using a metal-induced lateral crystallization technique (MILC) to crystallize a thin layer of amorphous silicon. In various embodiments, a selective epitaxy process is performed to form the raised source region of the access transistor.

These and other aspects, embodiments, advantages, and features will become apparent from the following description of the present subject matter and the referenced drawings.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive. Other embodiments may be utilized and structural, logical, and electrical changes may be made without departing from the scope of the present subject matter. The following detailed description is, therefore, not to be taken in a limiting sense, and the scope of the present subject matter is defined only by the appended claims, along with the full scope of equivalents to which such claims are entitled.

The present subject matter relates to a one-device equivalent gated lateral thyristor-based SRAM (GLTRAM) cell. The GLTRAM cell includes an access transistor and an integrated, gate-assisted lateral thyristor. The geometry of the lateral thyristor is accurately controlled to provide a lower stored charge volume. Additionally, the geometry of the gate-assisted lateral thyristor is capable of being tailored to reduce carrier transit time which provides faster performance and improves the gate-assisted turn-off characteristics of the thyristor.

Cell Structure

Figure 1:
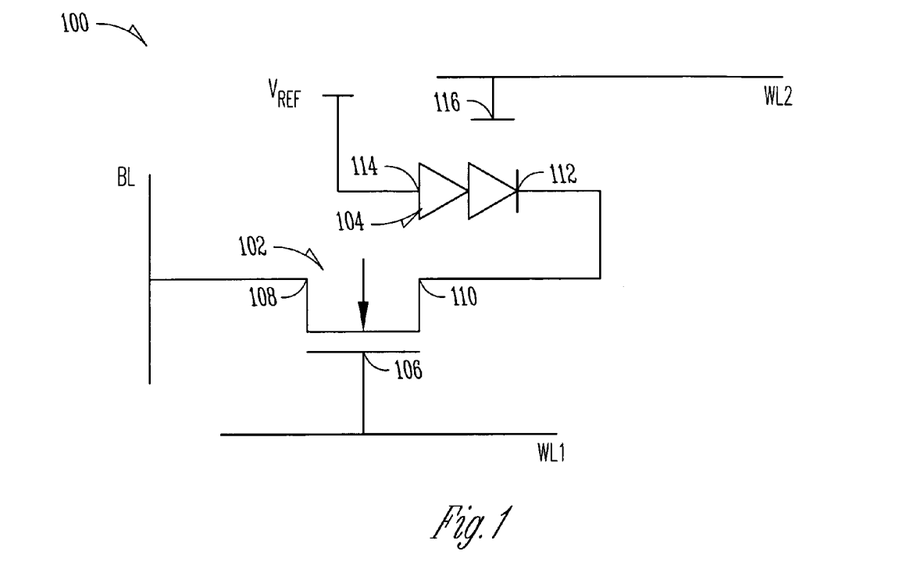
FIG. 1 illustrates a circuit schematic of a GLTRAM cell according to various embodiments of the present subject matter.

FIG. 1 illustrates a circuit schematic of a GLTRAM cell according to various embodiments of the present subject matter. The illustrated GLTRAM cell 100 includes an access transistor 102 and a thyristor 104. In various embodiments, the access transistor 102 is an NFET transistor. In various embodiments, the thyristor 104 is a p+/n/p/n+ thyristor (illustrated as two diodes in the schematic). One definition of a thyristor is a semiconductor device for high power switching. Thyristors also have been referred to as a semiconductor-controlled rectifier (SCR). One of ordinary skill in the art will appreciate upon reading and comprehending this disclosure, the present subject matter is not limited to a particular type of semiconductor doping.

A first word line (WL1) is connected to a gate 106 of the access transistor 102. A bit line (BL) is connected to a first source/drain diffusion region 108 (herein after referred to as a drain region to simplify the disclosure) of the access transistor 102. A second source/drain diffusion region 110 (hereinafter referred to as a source region to simplify the disclosure) of the access transistor 102 is connected to a first end 112 of the thyristor 104. A second end of the thyristor is connected to a reference voltage ($V_{REF}$). For a p+/n/p/n+ thyristor, the first end 112 is formed with the n+ region of the thyristor, and is referred to as a cathode, and the second end 114 is formed by the p+ region of the thyristor 104, and is referred to as an anode. A thyristor gate 116 is connected to a second word line (WL2). The gate 116 assists with switching the thyristor 104.

For the p+/n/p/n+ thyristor, the thyristor gate 116 provides a field to the thyristor 116 around the p region, which significantly increases the turn-off speed of the thyristor 104 and allows a low-voltage turn on of the thyristor 104. Additionally, standby leakage power is reduced.

The second diffusion (source) region 110 functions as a storage node for the memory cell 100. A charge stored at the source region 110 is read by turning on the access transistor 102 (providing a first word line pulse) and sensing the bit line. A write-one operation is performed by providing a first word line pulse to turn on the access transistor 102 and provide a current path between the thyristor 104 and the bit line (BL), which is held at a low potential, and providing a second word line pulse to assist with a low-voltage turn on of the thyristor 104. In this state, the thyristor is "on" and the reference potential is transferred from the anode to the cathode of the thyristor to store "one". A write-zero operation is performed by providing a bit line pulse of a sufficient potential to reverse bias the thyristor 104, providing a first word line pulse to turn on the access transistor and provide a current path between the bit line (BL) and the thyristor 104, and providing a second word line pulse to increase the turn-off speed of the thyristor 104. The thyristor 104 is reversed biased to a sufficient voltage for a sufficient time period to allow the charge carriers to recombine.

According to various embodiments, a lateral p+/n/p/n+ thyristor 104 is integrated on top of the access transistor 102. In the illustrated embodiment, the raised source 110 for the access transistor functions as the cathode node for the thyristor 104. The drain node 108 of the access transistor is connected to the bit line (BL). The first word line (WL1) is connected to the gate 106 of the access transistor 102 while the second word line (WL2) gates the p/n+ diode part of the thyristor 104 with the fringe field extending into the n region of the thyristor. The p+ node of the thyristor is connected to a reference voltage source ($V_{REF}$). The reference voltage is typically around 0.8 to 1.0 volts, and the programming pulses on the bit lines and the word lines are typically around 2.0 volts.

Figure 2:
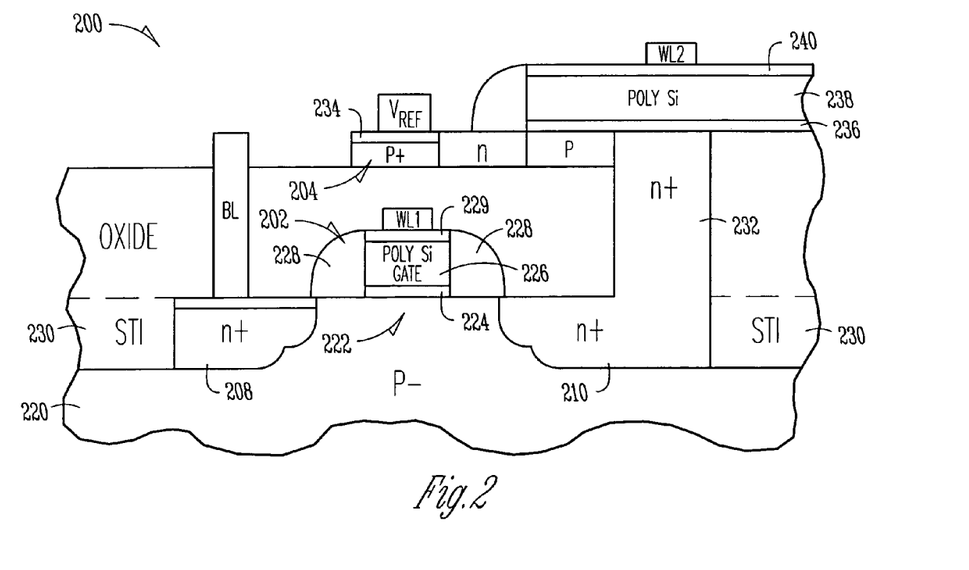
FIG. 2 illustrates a cell cross-section of a GLTRAM cell according to various embodiments of the present subject matter.

FIG. 2 illustrates a cell cross-section of a GLTRAM cell according to various embodiments of the present subject matter. The illustrated memory cell 200 is built on a p– substrate 220 with n+ diffusion regions functioning as a drain diffusion region 208 and a source diffusion region 210. A channel region 222 extends between the drain diffusion region 208 and the source diffusion region 210. A gate oxide layer 224 is formed over the channel region 222, and a polysilicon gate 226 is formed on the gate oxide layer 224. A spacer 228 is formed around the polysilicon gate 226. The drain region 208 and the polysilicon gate 226 are silicided (as illustrated by the silicide region 229) in preparation for contacting a bit line (BL) and a first word line (WL1), respectively. The access transistor 202 of the cell 200 is isolated from the access transistors in adjacent cells using shallow trench isolation (STI) 230.

The source region 210 of the transistor 202 includes a raised source region 232. In various embodiments, the raised source region 232 is formed using a selective epitaxy process. The raised n+ source region 232 forms the cathode of the p/n/p/n+ lateral thyristor. The p+ region forms the anode of the thyristor 204, is silicided (as illustrated by the silicide region 234), and is connected to a reference voltage $V_{REF}$. The lateral thyristor is accurately formed to provide a lower stored charge volume in the p-region of the thyristor and to reduce carrier transit time for faster performance and better control of the turn-off characteristics of the thyristor.

A thyristor gate oxide 236 is formed on top of the thyristor 204, and a polysilicon thyristor gate 238 is formed on the thyristor gate oxide 236. The polysilicon thyristor gate 236 is silicided (as illustrated by the silicide region 240) in preparation for contacting a second word line (WL2). The gate-assisted switching of the accurately formed, thin, lateral thyristor according to the present subject matter is more effective than the gate-assisted switching of vertical thyristors.

The thin film silicon layer used to form the thyristor 204 is initially doped with n-type impurities at a doping level of 1E17 or lower, which remains the doping level for the p+/n background level of the thyristor 204. All other regions of the gates for the first and second word lines are heavily doped with n-type impurities although the gate for the thyristor could also be p-type taken into consideration the work function difference associated with such option.

Figure 3A:
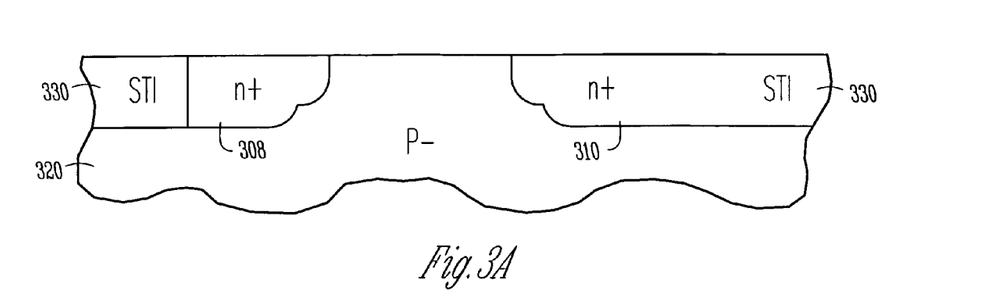
FIGS. 3A-3E illustrate a process for forming the GLTRAM cell of FIG. 2 according to various embodiments of the present subject matter.

FIGS. 3A-3E illustrate a process for forming the GLTRAM cell of FIG. 2 according to various embodiments of the present subject matter. The process steps for fabrication of the GLTRAM device 300 is compatible to standard processing technology. Referring to FIG. 3A, the n+ diffusion regions 308 and 310 for the access transistor are formed in a p– substrate 320 using standard fabrication steps. The access transistor is isolated using shallow trench isolation (STI) processing techniques, as represented by the illustrated STI regions 330.

Figure 3B:
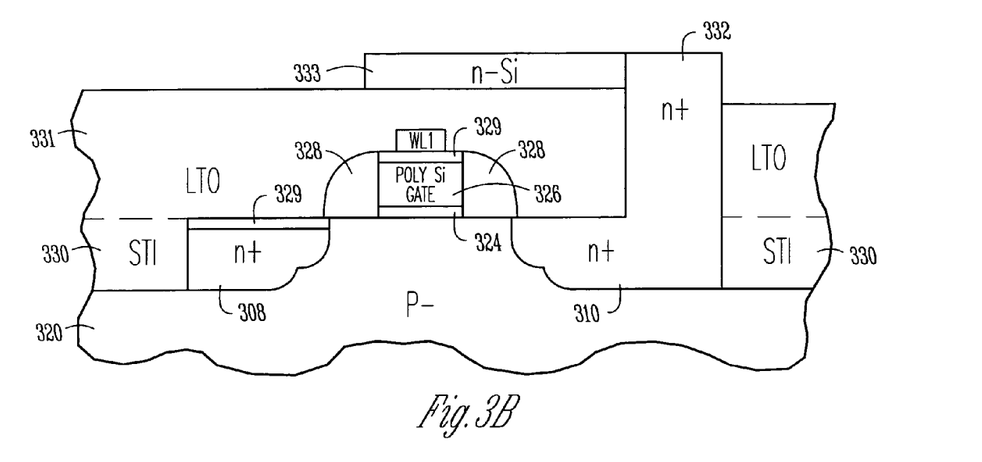

FIG. 3B shows a formed gate oxide 324, polysilicon gate 326, and corresponding spacer 328. The drain region 308 and the polysilicon gate 326 are silicided (shown as 328) for contact to a bit line (BL) and a first word line (WL1), respectively. A block source mask (BS) is used to prevent the silicidation of the n+ diffused source region 310. An oxide layer 331, such as a low-temperature oxide layer (LTO), is deposited. The n+ cathode region 332 of the thyristor is defined in the oxide layer, and windows are opened in the silicon for selective epitaxy deposition process to raise the defined n+ source region to form the n+ cathode region of the thyristor. A thyristor cathode mask (TCM) is used to perform the selective epitaxy process to form the raised source region 332 of the access transistor. A thin layer of n-doped amorphous silicon 333 is deposited. In various embodiments, the layer of amorphous silicon is between 300 A to 1000 A. An amorphous silicon film mask (SFM) is used to accurately and controllably deposit the amorphous silicon 333 in a desired position and with a desired geometry for the thyristor.

Figure 3C:
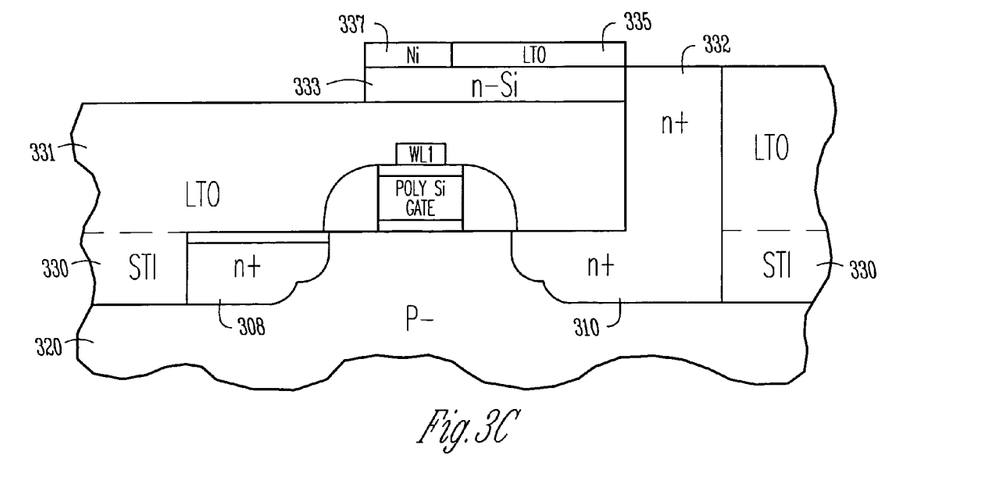

Referring to FIG. 3C, a layer of LTO 335 is deposited and defined over the active region of the access device for crystallization of silicon. The amorphous silicon is crystallized using a metal-induced lateral crystallization (MILC) technique. Metal-induced-lateral-crystallization (MILC) uses the lateral migration of metals, such as nickel to enhance the grain size and provide better crystallinity. The MILC process also smoothes out the polysilicon surface. In various embodiments, nickel 337 is deposited over the defined anode region of the thin silicon film 333. In various embodiments, about 100 A of nickel is deposited. A thyristor anode mask (TAM) is used to deposit nickel on the amorphous silicon as part of the MILC process. The lateral crystallization is carried out in a nitrogen ambient.

Figure 3D:
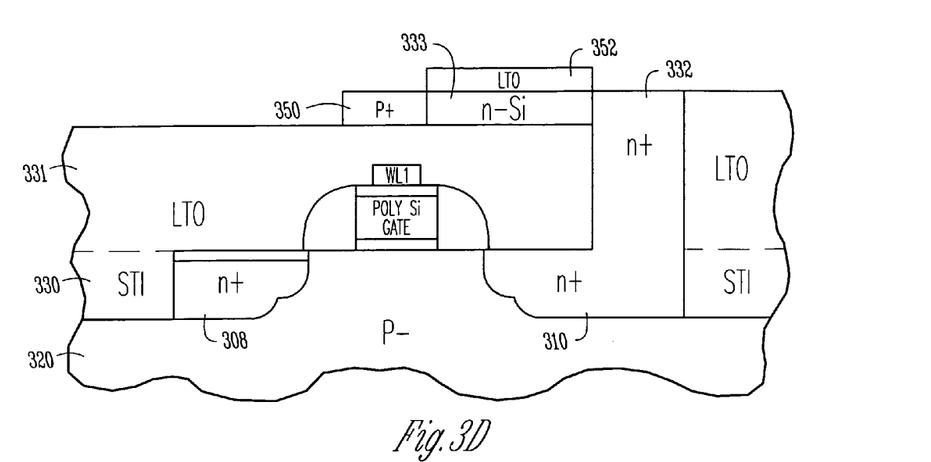

Referring to FIG. 3D, the nickel is removed after crystallization. The LTO is used as an input mask, and boron is implanted to define the p+ anode region of the thyristor. The mask level that defines the removable metal strip (such as nickel, for example) for MILC, is used to define the p+ anode region 350 of the thyristor. MILC uses a low temperature oxide (LTO), which is an oxide deposited by CVD at low temperature (below ~500° C.). The LTO 352 acts as an implant mask for the p+ anode implant.

Figure 3E:
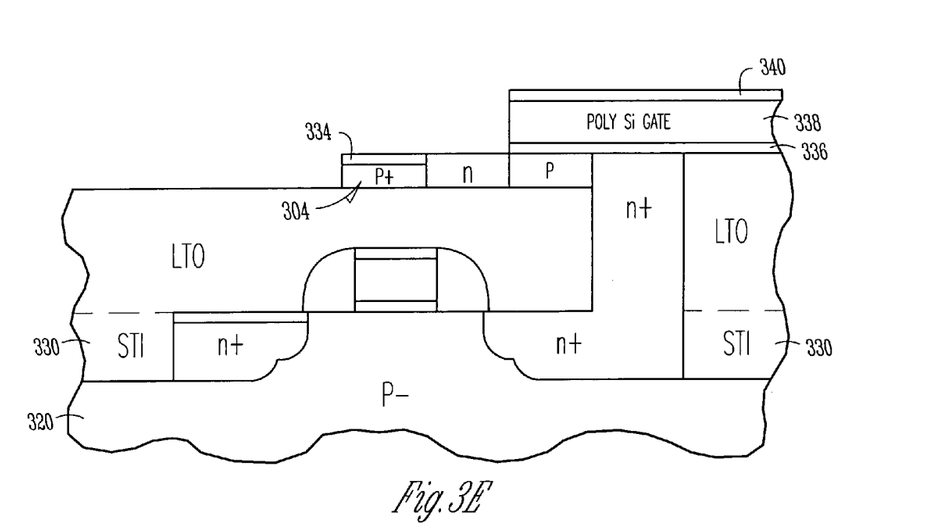

Referring to FIG. 3E, the LTO is removed and a gate oxide 336 is grown on top of the crystallized silicon thin film. A second word line polysilicon gate mask (PG2) is used to define the thyristor gate oxide 336, the p-region of the thyristor 304, and the polysilicon gate 338. Boron is implanted to form the p region of the thyristor. The boron concentration is ~1E17. The boron penetrates through the gate oxide 336 and counter dopes the n-silicon thin film. The n+ region remains unaffected due to boron penetration because of the significantly higher doping concentration of the n+ region of the cathode (concentration ~1E20-2E20). The polysilicon gate 338 for the thyristor 304 is formed on the gate oxide 336. After the gate processing step, both the anode p+ and the poly n+ gate for the second word line are silicided, as shown at 334 and 340, using standard processing steps. Throughout this specification, the term silicided or silicide refers to a metal silicide such as a nickel-silicide ($NiSi_2$ or $Ni_2Si$), cobalt-silicide ($CoSi_2$), titanium-silicide ($TiSi_2$), tungsten-silicide ($WSi_2$), and the like. These silicides reduce the parasitic series resistance. Contact and metallization steps follow.

Figure 4:
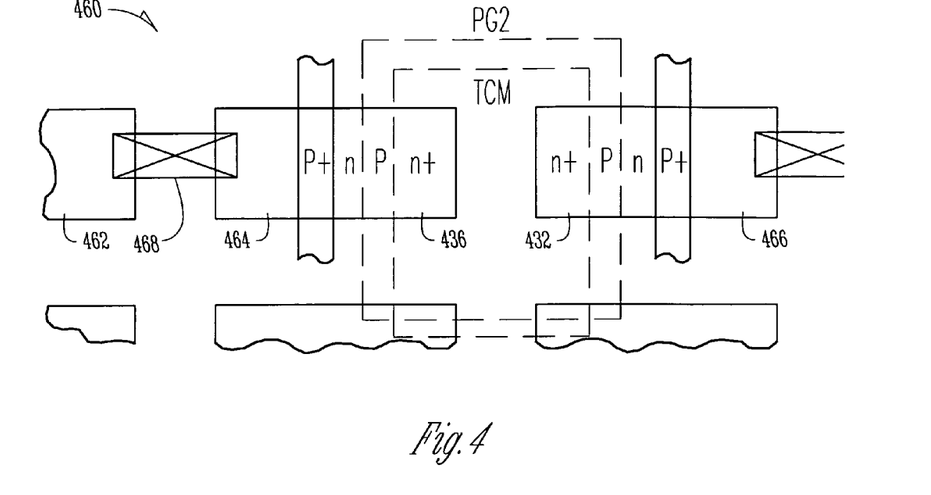
FIG. 4 illustrates a top view of adjacent GLTRAM cells in a memory array according to various embodiments of the present subject matter.

FIG. 4 illustrates a top view of adjacent GLTRAM cells in a memory array according to various embodiments of the present subject matter. The illustrated memory array 460 includes a first memory cell 462, a second memory cell 464, and a third memory cell 466. The first and second memory cells 462 and 464 share a bit line contact 468. That is, the drain regions of the first and second memory cells are in contact with a shared bit line contact. Additionally, the second and third memory cells 464 and 466 share a thyristor gate, as illustrated by the second polysilicon gate (PG2) mask line. The thyristor gate assists with switching the lateral thyristors in both the first memory cell 462 and the second memory cell 464. FIG. 4 also illustrates that the second memory cell 464 and the third memory cell 466 share a thyristor cathode mask (TCM) used to form the raised n+ source region of the access transistors in both the second memory cell and the third memory cell. Cell density is improved by sharing bit line contacts and thyristor gates, but such sharing is not required by the present subject matter.

The cathode regions of the cell thyristors are shown as n+ regions 432 and 436 and are defined by an appropriate mask prior to the selective-epitaxy process for raising the source regions of the, associated access transistors. The mask level defining the raised n+ regions is labeled a thyristor cathode mask (TCM). The second polysilicon word line gate overlaps the n+ regions to precisely define the p regions of the associated thyristors. The p regions are formed by counter-doping the background n-region of the thin film silicon layer of the thyristor using the boron implanted polysilicon gate as the doping source. An appropriate dose of boron is implanted into the gate, and a rapid thermal anneal (RTA) is performed to diffuse the boron through the gate oxide and counter-dope the region below. In this manner, a self-aligned highly controlled p-region of the thyristor is defined. This controlled formation lowers the stored charge volume, improves the turn-off characteristics of the thyristor, and allows the memory cell to have a fast performance. The polysilicon gate for the thyristor is subsequently doped with a heavy dose of n+ impurity (e.g. phosphorous) to form the n+ gate.

Cell Operation

Figure 5:
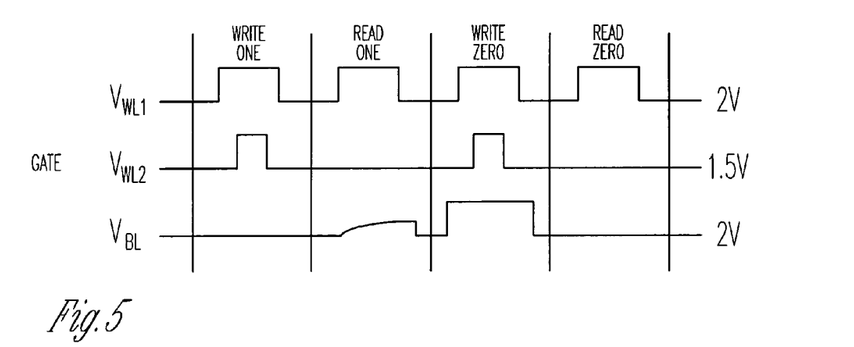
FIG. 5 illustrates read-write operations for GLTRAM cells according to various embodiments of the present subject matter.

FIG. 5 illustrates read-write operations for GLTRAM cells according to various embodiments of the present subject matter. The illustrated read-write operations correspond to a GLTRAM cell formed by an NFET access transistor and a p+/n/p/n+ thyristor, such as is illustrated in FIGS. 1-2. As one of ordinary skill in the art will understand, upon reading and comprehending this disclosure, the cell of the present subject matter can be designed to operate using different voltages. By way of example, and without limitation, one of ordinary skill in the art will understand, upon reading and comprehending this disclosure, how to incorporate a PFET access transistor instead of an NFET access transistor. Since electrons are significantly more mobile than holes, a memory cell incorporating an NFET access transistor is faster than a memory cell incorporating a PFET access transistor.

In various embodiments, the power supply voltage (Vdd) is approximately 2.0 volts, the pulse potential of the first word line (WL1) is approximately 2.0 volts, the pulse potential of the bit line (BL) is approximately 2.0 volts, the pulse potential of the reference node ($V_{REF}$) is approximately 0.8 volts, and the pulse potential of the second word line (WL2) is approximately 1.5 volts.

WL2 is pulsed for both write-one and write-zero operations while the bit line is pulsed only for write-zero. During write-one, the second word-line (WL2) assists the thyristor in forward-biased "on"-mode in which the thyristor is conducting and raising the potential of the floating bit line. During write-zero, the bit line (BL) pulse reverse biases the cathode node of the thyristor while the second word line (WL2) pulse assists in switching the thyristor off completely within the short duration of the reverse biased pulse of the bit line (BL). The cell is read by turning on the access transistor using the first word line (WL2) and sensing the stored charge on the bit line (BL).

The cell performance is dependent on the thyristor turn-off speed (write-0) which is dramatically enhanced by using a thyristor gate, and in particular, a lateral, thyristor gate. Since the stored charge volume is significantly lower in the lateral thyristor, the gate-assisted lateral thyristor is expected to be turned off within one nanosecond of the bit line pulse, thereby significantly improving the performance of the cell.

Figure 6:
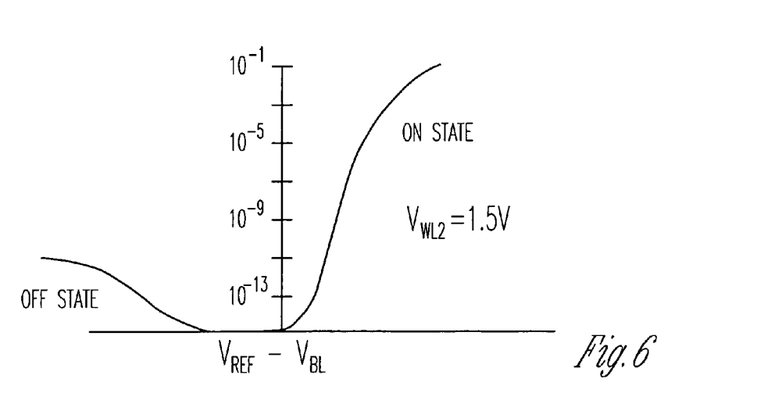
FIG. 6 illustrates forward and reverse I-V characteristics of GLTRAM cells according to various embodiments of the present subject matter in which the second word line voltage is approximately 1.5 volts.

FIG. 6 illustrates forward and reverse I-V characteristics of GLTRAM cells according to various embodiments of the present subject matter in which the second word line voltage is approximately 1.5 volts. The figure illustrates that the second word line voltage allows a small forward bias potential (represented by the difference between $V_{REF}$ and the bit line potential $V_{BL}$) to turn on the thyristor. The figure also illustrates that the GLTRAM has a very small standby current in the OFF state.

System Level

Figure 7:
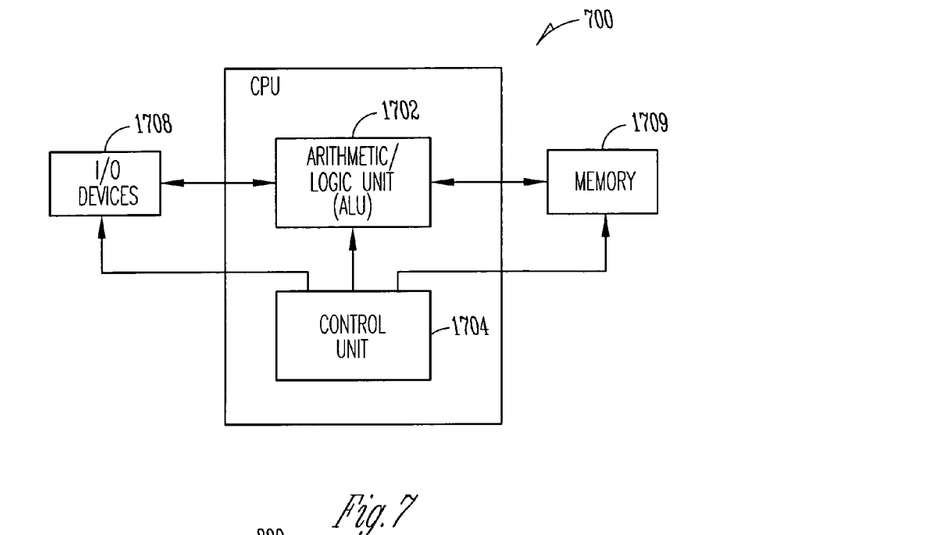
FIG. 7 is a simplified block diagram of a high-level organization of various embodiments of an electronic system according to the present subject matter.

FIG. 7 is a simplified block diagram of a high-level organization of various embodiments of an electronic system according to the present subject matter. In various embodiments, the system 700 is a computer system, a process control system or other system that employs a processor and associated memory. The electronic system 700 has functional elements, including a processor or arithmetic/logic unit (ALU) 702, a control unit 704, a memory device unit 706 and an input/output (I/O) device 708. Generally such an electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. According to various embodiments, the memory device 706 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include a GLTRAM cell in accordance with the present subject matter.

Figure 8:
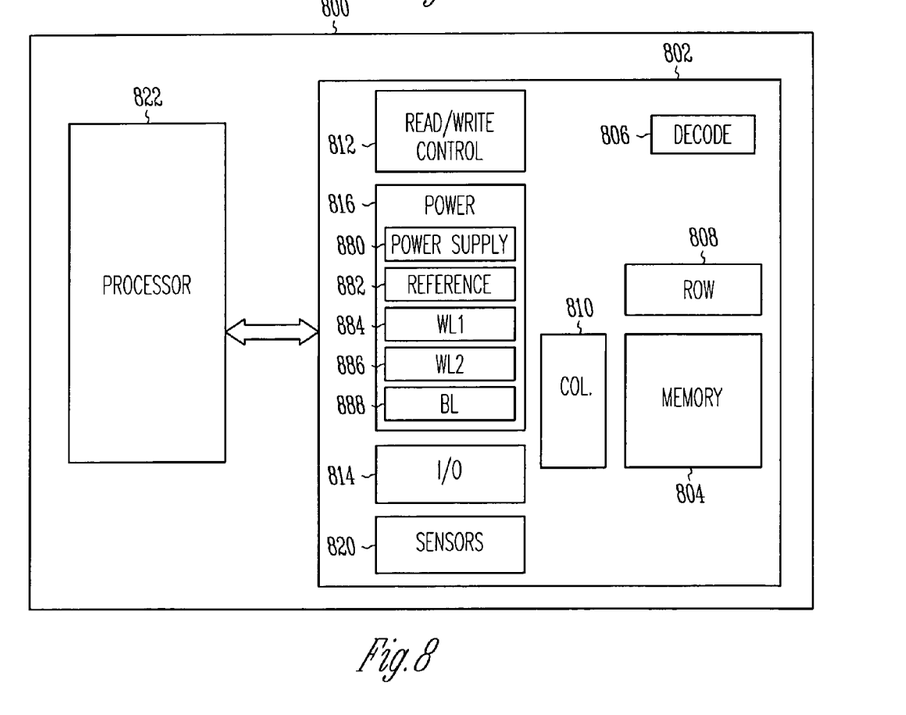
FIG. 8 is a simplified block diagram of a high-level organization of various embodiments of an electronic system according to the present subject matter.

FIG. 8 is a simplified block diagram of a high-level organization of various embodiments of an electronic system according to the present subject matter. The system 800 includes a memory device 802 which has an array of memory cells 804, address decoder 806, row access circuitry 808, column access circuitry 810, read/write control circuitry 812 for controlling operations, and input/output circuitry 814. The memory device 802 further includes power circuitry 816, and sensors 820 such as current sensors for determining whether a memory cell is in a low-threshold conducting state or in a high-threshold nonconducting state. The illustrated power circuitry 816 includes power supply circuitry 880, circuitry 882 for providing a reference voltage, circuitry 884 for providing the first word line with pulses, circuitry 886 for providing the second word line with pulses, and circuitry 888 for providing the bit line with pulses. Also, as shown in FIG. 8, the system 800 includes a processor 822, or memory controller for memory accessing. The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 includes the GLTRAM cell according to the present subject matter.

The illustration of system, as shown in FIG. 8, is intended to provide a general understanding of one application for the structure and circuitry of the present subject matter, and is not intended to serve as a complete description of all the elements and features of an electronic system using GLTRAM cells according to the present subject matter. As one of ordinary skill in the art will understand, such an electronic system can be fabricated in single-package processing units, or even on a single semiconductor chip, in order to reduce the communication time between the processor and the memory device.

Applications containing GLTRAM cells, as described in this disclosure, include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

The present subject matter relates to a one-device equivalent gated lateral thyristor-based SRAM (GLTRAM) cell. The GLTRAM cell includes an integrated, gate-assisted lateral thyristor that is accurately formed to provide lower stored charge volume and to reduce carrier transit time. Thus, the gate-assisted turn-off characteristic of the thyristor is improved and faster SRAM-like performance is obtained.

The GLTRAM cell is readily scalable with lithography so as to provide direct scalability with technology generations. The stacked configuration of the GLTRAM cell has a footprint less than 8 F², and thus provides good DRAM-like memory cell density.

This disclosure includes several processes, circuit diagrams, and cell structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A method, comprising:
   forming a lateral thyristor electrically connected to a source of an access transistor, where the lateral thyristor has doped regions and every doped region of the lateral thyristor is laterally adjacent to at least one other doped region; and
   forming a thyristor gate to enhance switching of the lateral thyristor.

2. The method of claim 1, wherein the source of the access transistor is raised, and wherein forming the lateral thyristor includes: forming the lateral thyristor over the access transistor, and integrating an end of the thyristor with the raised source of the access transistor.

3. The method of claim 1, wherein forming the lateral thyristor includes:
   depositing a layer of amorphous silicon; and
   crystallizing the layer of amorphous silicon to form a crystallized layer of silicon.

4. The method of claim 3, wherein crystallizing the layer of amorphous silicon includes performing a metal-induced-lateral crystallization (MILC) technique.

5. The method of claim 1, wherein forming the lateral thyristor includes forming a lateral p+/n/p/n+ thyristor.

6. A method, comprising:
   forming a lateral thyristor connected to a raised source of an access transistor, where the lateral thyristor has doped regions and every doped region of the lateral thyristor is laterally adjacent to at least one other doped region; and
   forming a thyristor gate to enhance switching of the lateral thyristor.

7. The method of claim 6, wherein forming the lateral thyristor includes forming the lateral thyristor over the access transistor.

8. The method of claim 6, wherein forming the lateral thyristor includes:
   depositing a layer of amorphous silicon; and
   crystallizing the layer of amorphous silicon to form a crystallized layer of silicon.

9. The method of claim 8, wherein crystallizing the layer of amorphous silicon includes performing a metal-induced-lateral crystallization (MILC) technique.

10. The method of claim 6, wherein forming the lateral thyristor includes forming a lateral p+/n/p/n+ thyristor.

11. A method of forming a gated lateral thyristor connected to a raised source of an access transistor of a memory cell, comprising:
    depositing a layer of amorphous silicon above the access transistor between a desired first terminal location and the raised source of the access transistor;
    crystallizing the layer of amorphous silicon to form a crystallized layer of silicon using a metal-induced-lateral crystallization (MILC) technique;
    doping the crystallized layer of silicon to form a thyristor, where the lateral thyristor has doped regions and every doped region of the lateral thyristor is laterally adjacent to at least one other doped region; and
    forming a thyristor gate to enhance switching of the lateral thyristor.

12. The method of claim 11, wherein the raised source of the access transistor is doped to form an n+ source, and wherein doping the crystallized layer of silicon to form a thyristor includes doping the crystallized layer of silicon to form a p+/n/p/n+ thyristor using the n+ raised source of the access transistor as a cathode of the thyristor.

13. The method of claim 12, wherein dimensions of the p+/n/p/n+ lateral thyristor are scalable with lithographic advances in future technology generations and are capable of precisely controlling a stored charge in the p region of the lateral thyristor.

14. A method for forming a memory cell, comprising:
    forming an access transistor with a drain region to connect to a bit line, a raised source region, and a transistor gate to connect to a first word line; and
    forming a lateral thyristor with a first end formed with the raised source region of the access transistor, a second end to connect to a reference voltage, and a thyristor gate to connect to a second word line, where the lateral thyristor has doped regions and every doped region of the lateral thyristor is laterally adjacent to at least one other doped region.

15. The method of claim 14, wherein forming a lateral thyristor includes using a metal-induced lateral crystallization technique (MILC) to crystallize a thin layer of amorphous silicon.

16. The method of claim 14, wherein forming a lateral thyristor includes forming the lateral thyristor over the access transistor.

17. The method of claim 14, wherein:
    forming an access transistor includes forming an n+ drain region and a raised n+ source region in a p− substrate; and
    forming a lateral thyristor includes forming a lateral p+/n/p/n+ thyristor in which the first end is an anode formed by the raised n+ source region and the second end is a cathode doped p+.

18. The method of claim 14, wherein forming an access transistor includes performing a selective epitaxy process to form the raised source region of the access transistor.

19. A method for forming a memory cell, comprising:
    forming an access transistor with an n+ drain region to connect to a bit line, a raised n+ source region, and a transistor gate to connect to a first word line, wherein a selective epitaxy process is performed to form the n+ raised source region; and
    forming a lateral p+/n/p/n+ thyristor with a p+ anode connected to a reference voltage, an n+ cathode formed with the raised n+ source region of the access transistor, and a thyristor gate to connect to a second word line, where every doped region of the lateral p+/n/p/n+ thyristor is laterally adjacent to at least one other doped region, wherein forming the lateral p+/n/p/n+ thyristor includes:

depositing a layer of amorphous silicon above the access transistor between a desired anode location and the raised source of the access transistor;

crystallizing the layer of amorphous silicon to form a crystallized layer of silicon using a metal-induced-lateral crystallization (MILC) technique;

doping the crystallized layer of silicon to form the lateral p+/n/p/n+ thyristor; and forming a thyristor gate to enhance switching of the lateral thyristor.

20. The method of claim 19, wherein forming a lateral p+/n/p/n+ thyristor includes forming the thyristor to precisely control a stored charge in the p region of the lateral thyristor.

21. A method for forming a memory array, comprising:

forming a number of memory cells in a number of rows and in a number of columns, wherein forming each of the number of memory cells includes:

forming an access transistor with a drain region, a raised source region, and a transistor gate to connect to a first word line; and forming a lateral thyristor with a first end formed with the raised source region of the access transistor and a second end to connect to a reference voltage, where the lateral thyristor has doped regions and every doped region of the lateral thyristor is laterally adjacent to at least one other doped region;

forming a bit line contact shared by the drain region of the first memory cell and the drain region of the second memory cell; and forming a thyristor gate shared by the second memory cell and the third memory cell to enhance switching of the lateral thyristor for the second memory cell and switching of the lateral thyristor for the third memory cell.

22. The method of claim 21, wherein forming a lateral thyristor includes using a metal-induced lateral crystallization technique (MILC) to crystallize a thin layer of amorphous silicon.

23. The method of claim 21, wherein forming an access transistor includes performing a selective epitaxy process to form the raised source region of the access transistor.

* * * * *